United States Patent
Luo et al.

(10) Patent No.: US 11,327,114 B2
(45) Date of Patent: May 10, 2022

(54) FULLY-AUTOMATIC CLOSED-LOOP DETECTION METHOD AND DEVICE FOR INTELLIGENT SUBSTATION

(71) Applicants: STATE GRID HEBEI ELECTRIC POWER RESEARCH INSTITUTE, Shijiazhuang (CN); STATE GRID CORPORATION OF CHINA, Beijing (CN); WUHAN KEMOV ELECTRIC CO., LTD, Wuhan (CN); STATE GRID HEBEI ENERGY TECHNOLOGY SERVICE CO., LTD., Shijiazhuang (CN)

(72) Inventors: Peng Luo, Shijiazhuang (CN); Hui Fan, Shijiazhuang (CN); Jingchao Yang, Shijiazhuang (CN); Xiaoguang Hao, Shijiazhuang (CN); Yuhao Zhao, Shijiazhuang (CN); Lei He, Shijiazhuang (CN); Qun Rao, Shijiazhuang (CN)

(73) Assignees: STATE GRID HEBEI ELECTRIC POWER RESEARCH INSTITUTE, Shijiazhuang (CN); STATE GRID CORPORATION OF CHINA, Beijing (CN); WUHAN KEMOV ELECTRIC CO., LTD, Wuhan (CN); STATE GRID HEBEI ENERGY TECHNOLOGY SERVICE CO., LT D, Shijiazhuang (CN)

(*) Notice: Subject to any disclaimer, the term of this patent is extended or adjusted under 35 U.S.C. 154(b) by 663 days.

(21) Appl. No.: 16/254,426

(22) Filed: Jan. 22, 2019

(65) Prior Publication Data
US 2019/0170822 A1    Jun. 6, 2019

Related U.S. Application Data

(63) Continuation of application No. PCT/CN2018/091528, filed on Jun. 15, 2018.

(51) Int. Cl.
*G01R 31/317* (2006.01)
*H04L 12/40* (2006.01)
(Continued)

(52) U.S. Cl.
CPC . *G01R 31/31724* (2013.01); *G01R 31/31703* (2013.01); *H04L 12/00* (2013.01); *H04L 12/40136* (2013.01)

(58) Field of Classification Search
None
See application file for complete search history.

(56) References Cited

U.S. PATENT DOCUMENTS

| | | | |
|---|---|---|---|
| 7,644,388 B1 * | 1/2010 | Daldoss | G03F 1/36 716/52 |
| 9,362,746 B2 | 6/2016 | Shaffer | |

(Continued)

FOREIGN PATENT DOCUMENTS

| | | |
|---|---|---|
| CN | 104184621 A | 12/2014 |
| CN | 105335342 A | 2/2016 |

(Continued)

OTHER PUBLICATIONS

Jarwala et al., End-to-end test strategy for wireless systems, IEEE, Conference Paper, pp. 940-946 (Year: 1995).*

(Continued)

*Primary Examiner* — Cynthia Britt
*Assistant Examiner* — Dipakkumar B Gandhi
(74) *Attorney, Agent, or Firm* — Hunton Andrews Kurth LLP

(57) ABSTRACT

The fully-automatic closed-loop detection method includes: comparing a SCD file of a to-be-tested substation with a device-type data template file, so as to determine whether configuration information about the to-be-tested substation is correct; when the configuration information about the (Continued)

to-be-tested substation is correct, parsing the SCD file of the to-be-tested substation and generating a SSD topological diagram of the to-be-tested substation; and acquiring a testing item from a predetermined testing item library in accordance with the SSD topological diagram of the to-be-tested substation, generating a testing scheme for the to-be-tested substation, performing a testing operation and outputting a testing result.

20 Claims, 8 Drawing Sheets

(51) Int. Cl.
  *H04L 12/00* (2006.01)
  *G01R 31/34* (2020.01)

(56) References Cited

U.S. PATENT DOCUMENTS

| | | | | |
|---|---|---|---|---|
| 2002/0038439 | A1* | 3/2002 | Sato | G01R 31/318307 714/724 |
| 2004/0255214 | A1* | 12/2004 | Hildebrant | G01R 31/31917 714/742 |
| 2010/0204948 | A1* | 8/2010 | Kirrmann | H02J 13/00034 702/117 |
| 2018/0267887 | A1* | 9/2018 | Dsouza | G06F 11/3688 |

FOREIGN PATENT DOCUMENTS

| | | | |
|---|---|---|---|
| CN | 105512213 A | * | 4/2016 |
| CN | 105512213 A | | 4/2016 |
| CN | 106528968 A | | 3/2017 |
| CN | 107255761 A | | 10/2017 |
| RU | 2464585 C2 | | 10/2012 |

OTHER PUBLICATIONS

Peng, et al., Research on intelligent periodic test operating system for bay level equipment of smart substation, Power System Protection and Control, China Academic Journal Electronic Publishing House, vol. 45, No. 2, Jan. 16, 2017, pp. 99-104, 6 pages.

First Office Action, issued by The State Intellectual Property Office of the People's Republic of China to corresponding Chinese Application No. 201711268544.6 dated Aug. 28, 2020, 35 pages.

* cited by examiner

FULLY-AUTOMATIC CLOSED-LOOP DETECTION METHOD AND DEVICE FOR INTELLIGENT SUBSTATION

CROSS-REFERENCE TO RELATED APPLICATIONS

The present application is a continuation of PCT Application No. PCT/CN2018/091528 filed on Jun. 15, 2018, which claims priority to the Chinese patent application No. 201711268544.6, filed on Dec. 5, 2017, both of which are incorporated by reference in their entireties.

TECHNICAL FIELD

The present disclosure relates to the field of substation technology, in particular to a fully-automatic closed-loop detection method and a fully-automatic closed-loop detection device for an intelligent substation.

BACKGROUND

Recently, the intelligent substation technology has developed rapidly, and as compared with a conventional substation, an intelligent substation is provided with a unified, object-oriented hierarchical information and service model. Interoperable intelligent electronic devices and a networked communication structure are adopted by the intelligent substation so as to enhance the information interaction and processing capability, but the organization and allocation of information for such a secondary device as a relay protection device becomes more complex. For most of the conventional intelligent substations, their primary and secondary systems are tested with reference to a method for a conventional substation, and it is impossible to automatically formulate a testing scheme in accordance with the structures of the first and secondary systems of the intelligent substation as well as device configuration information, so a visualization level of a closed-loop test for the intelligent substation is relatively low.

SUMMARY

An object of the present disclosure is to provide a fully-automatic closed-loop detection method and a fully-automatic closed-loop detection device for an intelligent substation, so as to solve the problem in the related art where it is impossible to automatically formulate a testing scheme and thereby the visualization level of the closed-loop test is relatively low.

In one aspect, the present disclosure provides in some embodiments a fully-automatic closed-loop detection method for an intelligent substation, including: comparing a substation configuration description (SCD) file of a to-be-tested substation with a device-type data template file, so as to determine whether configuration information about the to-be-tested substation is correct; when the configuration information about the to-be-tested substation is correct, parsing the SCD file of the to-be-tested substation and generating a system specification description (SSD) topological diagram of the to-be-tested substation; and acquiring a testing item from a predetermined testing item library in accordance with the SSD topological diagram of the to-be-tested substation, generating a testing scheme for the to-be-tested substation, performing a testing operation and outputting a testing result.

In another aspect, the present disclosure provides in some embodiments a fully-automatic closed-loop detection device for an intelligent substation, including: a comparison module configured to compare an SCD file of a to-be-tested substation with a device-type data template file, so as to determine whether configuration information about the to-be-tested substation is correct; a generation module configured to, when the configuration information about the to-be-tested substation is correct, parse the SCD file of the to-be-tested substation and generate an SSD topological diagram of the to-be-tested substation; and a testing module configured to acquire a testing item from a predetermined testing item library in accordance with the SSD topological diagram of the to-be-tested substation, generate a testing scheme for the to-be-tested substation, perform a testing operation and output a testing result.

In yet another aspect, the present disclosure provides in some embodiments an electronic device, including one or more processors, a memory, and one or more computer programs stored in the memory and capable of being executed by the one or more processors so as to implement the above-mentioned fully-automatic closed-loop detection method.

In still yet another aspect, the present disclosure provides in some embodiments a computer-readable storage medium storing therein a computer program, and the computer program is capable of being executed by a processor so as to implement the above-mentioned fully-automatic closed-loop detection method.

According to the embodiments of the present disclosure, the SCD file of the to-be-tested substation is compared with the device-type data template file so as to determine whether the configuration information about the to-be-tested substation is correct. When the configuration information about the to-be-tested substation is correct, the SCD file of the to-be-tested substrate is parsed, and the SSD topological diagram of the to-be-tested substrate is generated. Then, the testing item is acquired from the predetermined testing item library in accordance with the SSD topological diagram of the to-be-tested substation, so as to generate the testing scheme for the to-be-tested substation, perform the testing operation and output the testing result. As a result, it is able to automatically generate the testing item in accordance with the system structure of the substation and the device configuration information, and automatically perform the testing operation on the to-be-tested substation, thereby to improve a visualization level of a closed-loop test for the substation, and reduce the work intensity for the staff in the substation.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objectives, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
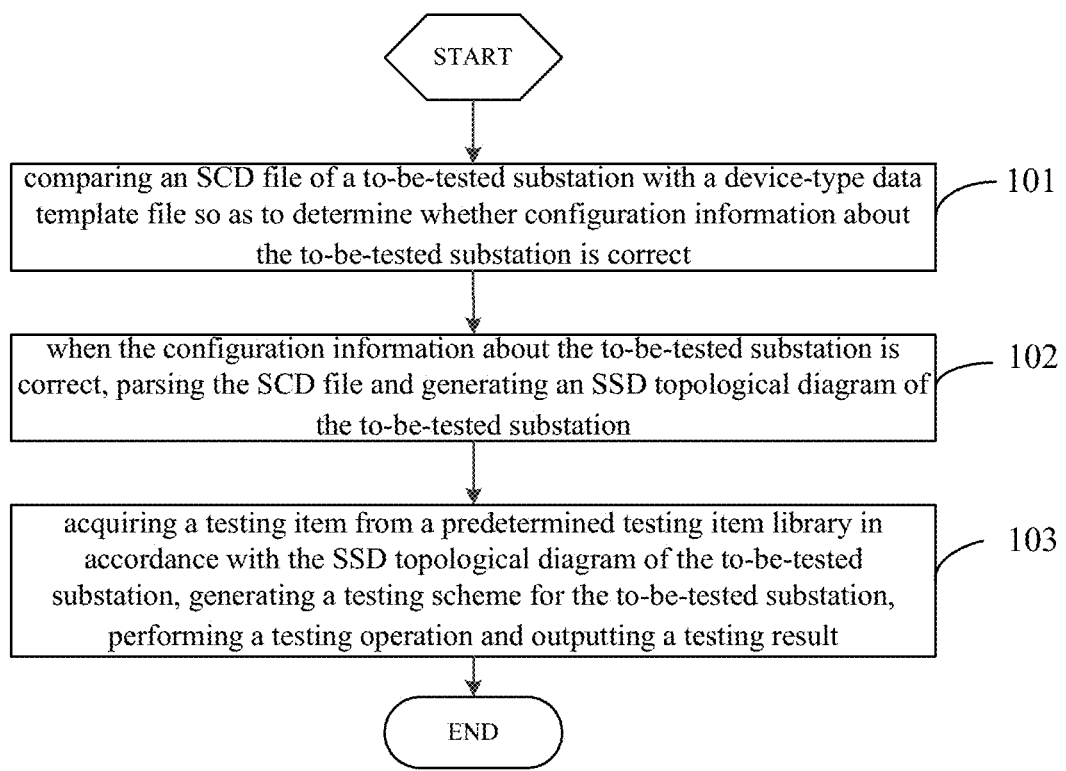
FIG. 1 is a flow chart of a fully-automatic closed-loop detection method for an intelligent substation according to some embodiments of the present disclosure.
Figure 2:
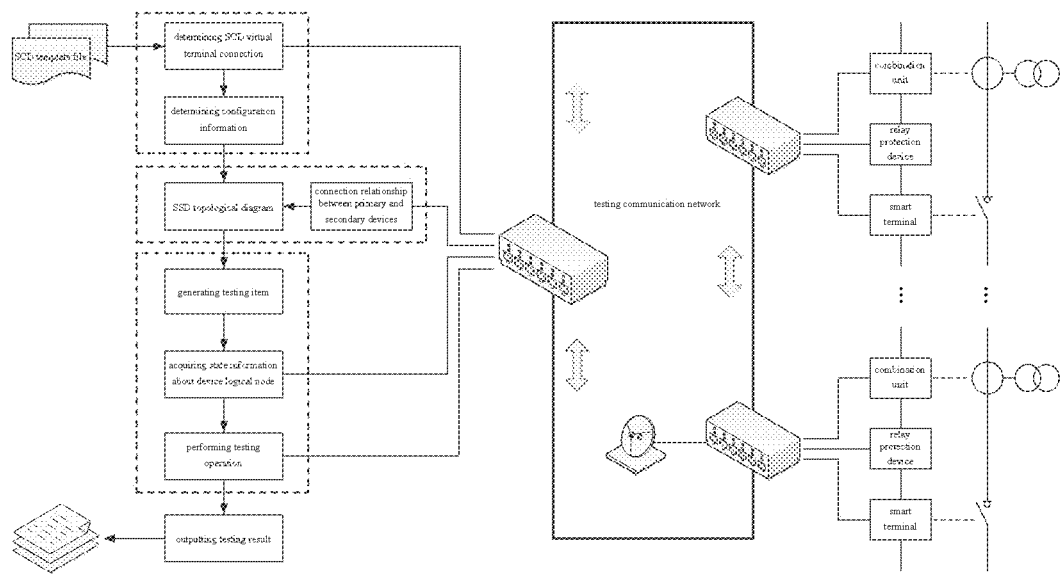
FIG. 2 is a schematic view showing a scenario for the fully-automatic closed-loop detection method according to some embodiments of the present disclosure.

The present disclosure provides in some embodiments a fully-automatic closed-loop detection method for an intelligent substation. FIG. 1 is a flow chart of the fully-automatic closed-loop detection method, and FIG. 2 is a schematic view showing a scenario for the fully-automatic closed-loop detection method. As shown in FIG. 1, the fully-automatic closed-loop detection method includes the following steps.

Step 101: comparing an SCD file of a to-be-tested substation with a device-type data template file so as to determine whether configuration information about the to-be-tested substation is correct.

It should be appreciated that, in the embodiments of the present disclosure, the fully-automatic closed-loop detection method may be applied to a fully-automatic closed-loop detection device. The fully-automatic closed-loop detection device may include a testing platform in communication with a to-be-tested device via a testing communication network.

The SCD file may be imported via the testing communication network and compared with a pre-stored virtual terminal connection standard template file, so as to determine whether the configuration information of the SCD file about the to-be-tested substation is correct.

To be specific, Step 101 may include: generating a virtual terminal connection typical template library in accordance with the virtual terminal connection standard template file; parsing the SCD file of the to-be-tested substation, and acquiring a connection relationship between virtual terminals of a protection device and an associated device in the SCD file; comparing the connection relationship between the virtual terminals with the corresponding virtual terminal connection standard template file in the virtual terminal connection typical template library, so as to determine whether a connection relationship between SCD virtual terminals of the to-be-tested substation is correct; and when the connection relationship between the SCD virtual terminals is correct, reading model configuration information in the SCD file of the to-be-tested substation, acquiring a device operating model of the to-be-tested substation, and comparing the model configuration information in the SCD file with the device operating model, so as to determine whether the configuration information about the to-be-tested substation is correct.

In the embodiments of the present disclosure, at first, it is necessary to detect each virtual terminal in the imported SCD file of the to-be-tested substation. The SCD file of the to-be-tested substation may be compared with the virtual terminal connection standard template file, so as to determine whether the configuration for the virtual terminals of relay protection-related devices in the SCD file and the connection relationship therebetween are correct and complete, so as to ensure that the configuration for the signal correlation between the relay protection device and an associated secondary device of the to-be-tested substation is correct, thereby to ensure the validity of the subsequent test.

To be specific, based on a conventional standard and a typical design scheme of the intelligent substation, the virtual terminal connection typical template library for the relay protection-related devices may be generated in accordance with the virtual terminal connection standard template file. The virtual terminal connection typical template library may be established using an Extensible Markup Language (XML) in accordance with a voltage level and an Intelligent Electronic Device (IED) type. The SCD file of the to-be-tested substation may be acquired, a connection relationship between the virtual terminals of the relay protection-related devices may be extracted, and then the to-be-tested device in the SCD file may be compared with a corresponding device in the virtual terminal connection standard template file, so as to determine whether the connection relationship between the virtual terminals of the to-be-tested device is correct. The above procedure may be repeated, until the connection relationship between the virtual terminals of all the to-be-tested devices has been detected. In the embodiments of the present disclosure, all comparison results may be outputted as diagrams on the basis of such types as connection error, redundancy and deletion, so that the working staff may determine the comparison results manually.

A specific implementation procedure will be described as follows.

An SV input virtual terminal check template and a GOOSE input virtual terminal check template each in an XML format may be established. Description of each virtual terminal and a meaning thereof may be represented by an attribute "desc" at a node "Inputs/ExtRef", and a check keyword may be created in accordance with the meaning of each virtual terminal. The check keyword may support a logical operation on a string, e.g., "AND" or "OR", among other things.

For example, the SV input terminal check template in the XML format may be expressed as:

```
<Inputs desc= "3/2 circuit breaker line protection SV input terminal list">
    <ExtRef desc= "voltage MU rated delay" keywords= "delay|t"/>
    <ExtRef desc= "protecting phase A voltage Ua1" keywords= "(phase A^voltage^1|Ua1"/>
    <ExtRef desc= "protecting phase A voltage Ua2" keywords= "(phase A^voltage^2|Ua2"/>
    <ExtRef desc= "protecting phase B voltage Ub1" keywords= "(phase B^voltage^1|Ub1"/>
    <ExtRef desc= "protecting phase B voltage Ub2" keywords= "(phase B^voltage^2|Ub2"/>
</Inputs>.
```

For example, the GOOSE input terminal check template in the XML format may be expressed as:

```
<Inputs desc= "3/2 circuit breaker line protection GOOSE input terminal list">
    <ExtRef desc= "side circuit breaker phase A position" keywords= "(side circuit breaker|side switch)^A^position"/>
    <ExtRef desc= "side circuit breaker phase B position" keywords= "(side circuit breaker|side switch)^B^position"/>
    <ExtRef desc= "side circuit breaker phase C position" keywords= "(side circuit breaker|side switch)^C^position"/>
</Inputs>
```

Establishment of the virtual terminal check template

1) An SV output virtual terminal check template and a GOOSE output virtual terminal check plate each in the XML format may be established, description of each virtual terminal and a meaning thereof may be represented by an attribute "desc" at a node "DataSet/FCDO", and a check keyword may be created. For example, the GOOSE output terminal check template in the XML format may be expressed as:

```
<DataSet name= "dsGOOSE" desc= "3/2 circuit breaker line protection GOOSE output terminal list">
    <FCDO desc= "side circuit breaker phase A" keywords= "side circuit breaker|side switch)^A^"/>
    <FCDO desc= "side circuit breaker phase B" keywords= "side circuit breaker|side switch)^B^"/>
    <FCDO desc= "side circuit breaker phase C" keywords= "side circuit breaker|side switch)^C^"/>
</DataSet>
```

An SV input soft strap check template and a GOOSE input/output soft strap check template each in the XML format may be established, each strap may be represented by "name=dsRelayEna" at a node "DataSet", description and a meaning of each strap may be represented by an attribute "desc" at the node "DataSet/FCDO", and a check keyword may be created. For example, the SV input soft strap check template in the XML format may be expressed as:

```
<DataSet name= "dsRelayEna" desc= "3/2 circuit breaker line protection SV input soft strap">
    <FCDO desc= "voltage SV reception" keywords= "voltage^reception"/>
    <FCDO desc= "side circuit breaker current SV reception" keywords= "side breaker circuit|side switch)^current^reception"/>
</DataSet>
```

2) Each IED in the SCD file may be marked. A pending SCD file may be imported, and the attributes "name" and "desc" at a node "IED" may be traversed so as to extract an IED list. Then, the IEDs may be classified and marked in accordance with a voltage level, an IED type (protection unit, combination unit, smart terminal or smart assembly), and a protection type. The IEDs are marked so as to provide normative names.

3) A template file may be read in accordance with the IED type, a node "IED/AccessPoint/Server/LDevice/LN0/Inputs/ExtRef" may be searched in the SCD file, and then a matching operation may be performed on the description "doName" at a node "IED/AccessPoint/Server/LDevice/LN" through "prefix/lnClass/lnInst/doName" in accordance with the selected iedName and an internal short address IntAddr. When there is a terminal in the template file but not at the node "Inputs/ExtRef", the terminal may be an unmatched input virtual terminal, and when there is a terminal at the node "Inputs/ExtRef" but not in the template file, the terminal may be a superfluous input virtual terminal.

4) A node "IED/AccessPoint/Server/LDevice/LN0/DataSet/FCDO" may be searched in the SCD file, a reference address may be created through "ldInst/prefix/lnClass/lnInst/doName/daName", and description about the virtual terminals corresponding to all addresses at a node "IED/AccessPoint/Server/LDevice/LN0" may be listed in accordance with the reference address. Then, a keyword matching operation may be performed on the description and the terminals defined in the template file. When there is a terminal in the template file but not at the node "DataSet/FCDO", the terminal may be an unmatched output virtual terminal, and when there is a terminal at the node "DataSet/FCDO" but not in the template file, the terminal may be a superfluous output virtual terminal.

5) A data set dsRelayEna of logical nodes may be searched in access points at a station level for ideName through IED/AccessPoint/Server/LDevice/LN0/DataSet, and a matching operation may be performed on an entry "strap" at the node "DataSet/FCDO" in the data set in accordance with the keywords in the template file. When there is a strap in the template file but not at the node DataSet/FCDO, the terminal may be an unmatched strap, and when there is a strap at the node DataSet/FCDO but not in the template file, the terminal may be a superfluous strap.

6) The connection may be further checked after the input and output virtual terminals have been checked. With respect to the input terminals at the node "IED/AccessPoint/Server/LDevice/LN0/Inputs/ExtRef", a reference path for each opposite IED output virtual terminal may be formed through "iedName/ldInst/prefix/lnClass/lnInst/doName". The description about each output virtual terminal may be acquired in accordance with the reference path, and then a matching operation may be performed on the description about the input virtual terminal and the description about the output virtual terminal in accordance with the keywords. When the matching operation has been performed successfully, the connection may be deemed as correct, and when the matching operation has been performed unsuccessfully, the connection may be deemed as incorrect.

7) A check result may be outputted. A check result for each IED may be given, and the unmatched, superfluous and mismatched terminals, straps and connections may be identified in diagrams.

When the connection relationship between the SCD virtual terminals of the to-be-tested device are correct, communication configuration information in the imported SCD file of the to-be-tested substation may be compared with communication model information in the virtual terminal connection standard template file, so as to determine whether the configuration information about the SCD file is correct. In this way, it is able to ensure the consistency between the to-be-tested device and a communication model, thereby to prevent the test validity from being adversely affected due to the occurrence of signal misalignment and communication service abnormality during the test.

To be specific, the virtual terminal connection standard template file may be read and parsed through a predetermined XML parser, so as to extract model configuration information related to the to-be-tested device, in units of logical node, from the virtual terminal connection standard template file. The extracted model configuration information (including data, data attribute, data set and various control blocks in the logical nodes) may be mapped to a Manufacturing Message Specification (MMS) named variable of a structure type, and then stored as a model virtual terminal connection standard template file 1 in the form of a structure tree "physical device-logical device-logical node-data type", for example.

Model information about each layer of the to-be-tested device may be acquired online via the testing communication network. To be specific, all the logical devices in a device model may be collected through "Get Server Directory", the logical nodes in each logical device may be collected through "Get Logical Device Directory", the data, control blocks and the data set in each logical node may be collected through "Get Logical Node Directory", the names and types of all data attributes for each piece of data may be collected through "Get Data Definition", a current value of each piece of data may be collected through "Get Data Values", and names of all items in the data set may be collected through "Get Data Set Directory". Then, a complete hierarchical information model of the to-be-tested device and a current value thereof may be acquired, and stored as a model virtual terminal connection standard template file 2.

The model virtual terminal connection standard template file 2 may be compared with the model virtual terminal connection standard template file 1 in both forward and backward manners, so as to determine whether the model virtual terminal connection standard template file 2 is consistent with the model virtual terminal connection standard template file 1, thereby to determine whether the configuration information about the SCD file of the to-be-tested substation is correct.

Step 102: when the configuration information about the to-be-tested substation is correct, parsing the SCD file and generating an SSD topological diagram of the to-be-tested substation.

When the configuration information about the to-be-tested substation is correct, it means that the connection relationship for the to-be-tested device is correct. Then, the SCD file of the to-be-tested substation may be parsed, and the SSD topological diagram of the to-be-tested substation may be generated in accordance with a parsing result. In this way, it is able to achieve the visualization of connection information and state information about all primary and secondary devices of the substation and facilitate the worker to intuitively acquire the connection information and the state information in accordance with the SSD topological diagram, thereby to facilitate the management of the substation by working staffs.

To be specific, Step 102 includes: when the configuration information about the to-be-tested substation is correct, parsing the SCD file of the to-be-tested substation, generating a main wiring diagram and a bay wiring diagram so as to generate the SSD topological diagram, and acquiring an association relationship between the primary device and the secondary device of the to-be-tested substation; and reading a network communication message of the secondary device, and mapping an operating parameter of the to-be-tested substation to the SSD topological diagram of the to-be-tested substation.

In the embodiments of the present disclosure, when the configuration information about the SCD file of the to-be-tested substation is correct, the SCD file may be parsed, and then the main wiring diagram and the bay wiring diagram of a primary system of the substation may be generated, so as to acquire the association relationship between the primary device and the secondary logical device as well as the logical node.

Further, MMS, SV and GOOSE network communication messages of the to-be-tested secondary devices (e.g., the protection device, the combination unit and the smart terminal) may be read in real time via the testing communication network, so as to acquire the operating parameters of the to-be-tested devices in the to-be-tested substation (e.g., a current/voltage value, a knife position of each switch, alarm information, functional validity information, temperature and light intensity), and map these operating parameters to the SSD topological diagram of the to-be-tested substation. In this way, it is able to achieve the information association and the visualization of the state information, thereby to facilitate the operation and maintenance of the devices, extend the application of a configuration file in the operation and maintenance of the substation, and improve a security control level of the substation.

Step 103: acquiring a testing item from a predetermined testing item library in accordance with the SSD topological diagram of the to-be-tested substation, generating a testing scheme for the to-be-tested substation, performing a testing operation and outputting a testing result.

To be specific, a topological structure and various bay protection configurations of the substation may be acquired in accordance with the SSD topological diagram of the to-be-tested substation, so as to acquire the testing item from the predetermined testing item library, automatically generate the testing scheme for the to-be-tested device, and automatically perform the testing operation on all the to-be-tested devices in accordance with the testing scheme. State information about target logical node models may be read online and compared with each other, the testing result may be automatically and synchronously diagnosed during the test, and the testing result may be outputted finally. In this way, it is able to achieve the automatic closed-loop management of the testing scheme, the testing procedure and the testing result for the to-be-tested device, prevent the occurrence of an error caused by a manual diagnosis, and improve the reliability and the efficiency of the closed-loop detection.

In a possible embodiment of the present disclosure, Step 103 may include: acquiring information about the to-be-tested device of the to-be-tested substation in accordance with the SSD topological diagram and the SCD file of the to-be-tested substation; extracting the testing item matching the information about the to-be-tested device from the predetermined testing item library, and generating the testing scheme for the to-be-tested substation in accordance with the testing item and a predetermined arrangement rule; outputting a fault amount to the to-be-tested device corresponding to each testing item in the testing scheme, and setting state information about a protection logical node corresponding to the to-be-tested device in the target logical node model; and comparing the state information about the protection logical node in the target logical node model with actual operating state information about a corresponding protection logical node of the to-be-tested device, performing the testing operation on the to-be-tested substation and outputting the testing result.

To be specific, the quantity of the to-be-tested devices of the to-be-tested substation as well as the information about the to-be-tested devices (e.g., the types and the functional units) may be acquired in accordance with the SSD topological diagram and the SCD file, and then the testing item matching each to-be-tested device may be extracted from the predetermined testing item library. The testing items of all the to-be-tested devices may be arranged appropriately in accordance with the predetermined arrangement rule, so as to generate the testing scheme for the to-be-tested substation.

In a possible embodiment of the present disclosure, the extracting the testing item matching the to-be-tested device from the predetermined testing item library and generating the testing scheme for the to-be-tested substation in accordance with the testing items and the predetermined arrangement rule includes: acquiring a protection logical node of the to-be-tested device, and extracting a testing item matching the protection logical node from the predetermined testing item library; and generating the testing scheme for the to-be-tested substation in accordance with the extracted testing items and the predetermined arrangement rule.

To be specific, each of to-be-tested devices may be divided into a plurality of protection logical nodes on the basis of its functions, each protection logical node may have an independent function, and different functions may correspond to different testing items. Through acquiring the protection logical nodes of each of to-be-tested devices, it is able to extract the testing items matching the protection logical nodes from the predetermined testing item library, and then generate the testing scheme for the to-be-tested substation in accordance with all the testing items and the predetermined arrangement rule.

Further, the fault amount may be outputted by a fault amount output module to the to-be-tested device in accordance with the testing item, and, the state information about the protection logical nodes in the target logical node model corresponding to the to-be-tested device may be set. The fully-automatic closed-loop detection device may perform information interaction with a SV interface, a GOOSE interface and an MMS interface via the testing communication network, so as to perform the closed-loop testing operation through SV and GOOSE services and acquire the state information about the protection logical node of the to-be-tested device through an MMS service.

The state information about the protection logical node in the target logical node model may be compared with the actual operating state information about the protection logical node of the corresponding to-be-tested device, and the corresponding comparison result may be outputted by the to-be-tested device, so as to complete the closed-loop testing.

It should be appreciated that, each logical node may correspond to one testing item in the testing item library, and each testing item may include a plurality of testing subjects.

For example, for a line protection device having a differential protection logical node and a distance protection logical node, a corresponding testing item PDIF_T1 may be preset in accordance with the differential protection logical node PDIF, and a corresponding testing item PDIS_T1 may be preset in accordance with the distance protection logical node PDIS. In the testing items, a corresponding testing subject PDIF_T1_D may be preset with respect to a fixed value D in the logical node. For a fixed differential protection logical node PDIF, its differential protection principle as well as its fixed value and control word name are fixed, so the corresponding testing item and the testing subject are fixed too. The testing item PDIF_T1 may be stored as a testing item corresponding to the differential protection logical node PDIF. Considering the extendibility of the PDIF differential protection principle, the testing item may also be extended, and the extended testing items may be differentiated from each other through suffixes T1, T2 and the like. The accuracy of the fixed value of the logical node may be tested by applying an excitation value suddenly, and there is a definite action standard for a relay within a given error range. For example, for the fixed value D of the differential protection logical node PDIF, its error may be 5%. When an excitation value of 0.95 D is applied suddenly, the relay shall not operate as required by the standard, and when an excitation value of 1.05 D is applied suddenly, the relay shall operate reliably as required by the standard.

The SSD topological diagram of the to-be-tested substation may be parsed through an XML parsing module, so as to read the information about the logical nodes of the to-be-tested device, and search the corresponding testing items from the predetermined testing item library in accordance with the information, thereby to acquire target device testing items. Then, the model information about the to-be-tested device may be extracted from the target device testing items, and stored as the target logical node model.

The fault amount output module of the testing platform may communicate with the to-be-tested device via the testing communication network, output a corresponding fault amount to the to-be-tested device in accordance with the predetermined testing item, assign a value to the corresponding logical node in the target logical node model, and store the acquired information about the target logical node in the target logical node model. During the implementation, through the SV service, the fault amount of the testing item may be outputted at a time point T0, so as to assign a value to the related data in the target logical node model. For example, when the differential protection logical node PDIF is tested with a fixed value of 0.95 D, the fault amount of 0.95 D may be outputted and meanwhile "False" may be assigned to PDIF.OP in the target logical node model. When the differential protection logical node PDIF is tested with a fixed value of 1.05 D, "True" may be assigned to PDIF.OP in the target logical node model.

In addition, a GOOSE information module may perform GOOSE information interaction with the to-be-tested device via the testing communication network, and a protection operating time point T1 in a GOOSE message may be recorded into the GOOSE information module. The testing platform may acquire a device operation event report through the MMS service interfaced with the station level, and store the relevant information in the report into the state information about the device logical node.

Finally, data about the operating time point of the to-be-tested device in the state information about the target logical node model and data about the operating time point of the corresponding device in the state information about the device logical node may be read, and compared with each other. When the two pieces of data are consistent with each other, it means that a protection operation result is correct, and otherwise, it means that the protection operation result is incorrect. For example, the testing platform may search for a protection operation event report "brcbTripInfo" at the time point T1 in accordance with the protection operating time point, read "PDIF.OP" in a corresponding data set from the report, and compare "PDIF.OP" with that in the target logical node model to determine whether they are consistent with each other, generate the testing result when they are consistent with each other, and then generate or print a testing report in a standard format in accordance with the testing result.

According to the embodiments of the present disclosure, the SCD file of the to-be-tested substation is compared with the device-type data template file, so as to determine whether the configuration information about the SCD file is correct. When the configuration information about the SCD file is correct, the SCD file may be parsed so as to generate the SSD topological diagram of the to-be-tested substation. Then, the testing item may be acquired from the predetermined testing item library in accordance with the SSD topological diagram, and the testing scheme for the to-be-tested substation may be generated so as to perform the testing operation and output the testing result. As a result, it is able to automatically generate the testing item in accordance with the system structure and the device configuration information of the substation, and automatically perform the testing operation on the to-be-tested device, thereby to improve the visualization level of the closed-loop test for the substation, and reduce the work intensity for the staff in the substation.

Figure 3:
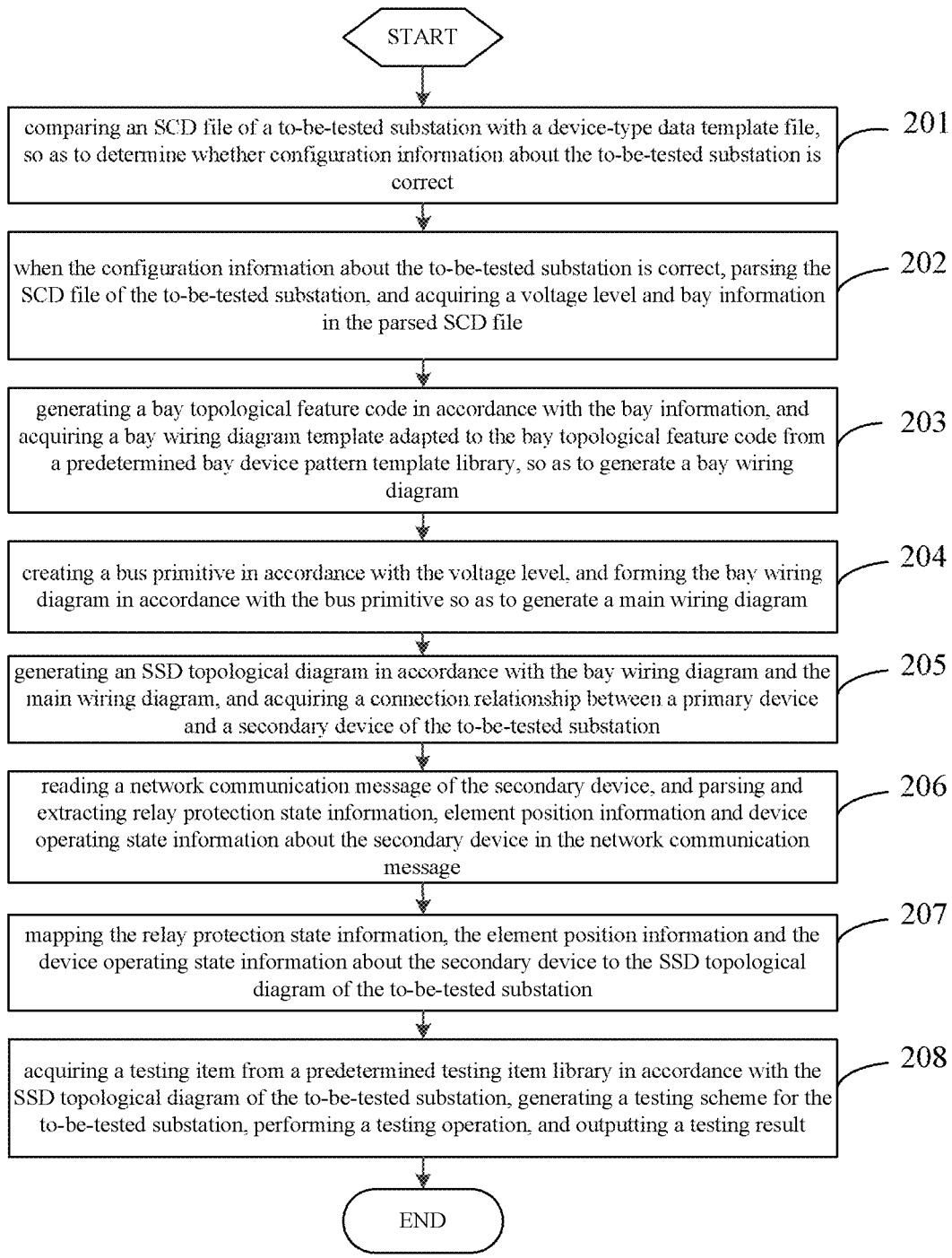
FIG. 3 is another flow chart of the fully-automatic closed-loop detection method according to some embodiments of the present disclosure.

The present disclosure further provides in some embodiments a fully-automatic closed-loop detection method for an intelligent substation which, as shown in FIG. 3, includes the following steps.

Step 201: comparing an SCD file of a to-be-tested substation with a device-type data template file, so as to determine whether configuration information about the to-be-tested substation is correct. This step may refer to the above Step 101, and thus will not be particularly described herein.

Step 202: when the configuration information about the to-be-tested substation is correct, parsing the SCD file of the to-be-tested substation, and acquiring a voltage level and bay information in the parsed SCD file.

In the embodiments of the present disclosure, the SCD file of the to-be-tested substation may be parsed, and a topological connection for a primary system of the substation may be analyzed in accordance with the parsed SCD file, so as to acquire the voltage level and the bay information. Then, connection points connected to a terminal of each primary device may be determined, and each terminal may be recorded in the corresponding connection point.

External connection points for a line bay and bays of a main transformer may be determined and marked as a bus connection point, e.g., Mn. Connection modes for the line bay and the bays of the main transformer (i.e., the bays at a high voltage side, an intermediate voltage side and a low voltage side) may be determined as follows. When there are 3 circuit breakers and 2 bus connection points, the line bay is a 3/2 circuit breaker line bay; when there is 1 circuit breaker and 2 bus connection points, the line bay is a double-bus line bay; when there is 1 circuit breaker and 1 bus connection point, the line bay is a single-bus line bay; and the others are abnormal. Connection modes for various voltage levels may be determined in accordance with the number of the bus connection points, the line bay and the bays of the main transformer, and a corresponding parallel bus for a double-bus line may be determined.

Step 203: generating a bay topological feature code in accordance with the bay information, and acquiring a bay wiring diagram template adapted to the bay topological feature code from a predetermined bay device pattern template library, so as to generate a bay wiring diagram.

To be specific, the bay information at least includes types of the devices in the bay and a topological connection relationship among the devices. The bay topological feature code may be generated in accordance with the bay information. For example, the devices in the bay may be traversed starting from the bus connection point, and a type of each node may be marked using a single letter, e.g., the bus connection point may be represented by "O", a line "IFL" may be represented by "L", and a circuit breaker "CBR" may be represented by "K". The nodes may be traversed starting form a root node, and numbered sequentially. A topological feature string may be formed through the marks of the node types and the node numbers, and the nodes at a same level may be placed in a bracket at a same level, e.g., "O2-{G3-{D4,P5,V6},D7}".

The bay topological feature code may be generated in accordance with the bay topological feature string, and where a corresponding template exists in the predetermined bay device pattern template library may be determined in accordance with the bay topological feature code. When the corresponding template does not exist in the predetermined bay device pattern template library, the bay wiring diagram template may be generated and stored in the predetermined bay device pattern template library. When the corresponding template exists in the predetermined bay device pattern template library, the bay wiring diagram may be generated in accordance with the corresponding bay wiring diagram template. The above procedure may be performed with respect to each bay, until all the bay wiring diagrams have been generated.

Step 204: creating a bus primitive in accordance with the voltage level, and forming the bay wiring diagram in accordance with the bus primitive so as to generate a main wiring diagram.

To be specific, the bus primitive may be created in accordance with information about the bus connection point at the voltage level and a connection mode thereof, and a relative position of the bus may be adjusted. Then, the bay wiring diagrams may be retrieved and arranged in accordance with a predetermined rule, and relative positions of the primitives corresponding to various voltage levels may be adjusted, so as to generate the main wiring diagram for the primary system of the substation.

It should be appreciated that, the predetermined rule may include: (1) a horizontal position of each bus segmentation bay is arranged between two buses; (2) each bay of main transformer at the high/intermediate/low voltage side is located at a side of the corresponding bus adjacent to the main transformer; (3) a primitive of the main transformer is located in the middle of the entire main wiring diagram, the bay at the high voltage side is located above the main transformer and on the top left of the entire main wiring diagram, the bay at the intermediate voltage side is located below the main transformer, and the bay at the low voltage is located on the top right of the entire main wiring diagram; and (4) each non-main-transformer bay on the bus shall be arranged at a side of the bus to which the bay is connected in accordance with a relative position of a parallel bus.

Step 205: generating an SSD topological diagram in accordance with the bay wiring diagram and the main wiring diagram, and acquiring a connection relationship between the primary device and a secondary device of the to-be-tested substation.

In the embodiments of the present disclosure, the bay wiring diagram and the main wiring diagram may be parsed, so as to acquire the connection relationship between the primary device and the secondary device in the to-be-tested devices of the substation. Information collected by the secondary device, e.g., switch knife position, protection state and current/voltage of a mutual inductor, may be acquired via the testing communication network. Parameters, e.g., the current and the voltage of the mutual inductor, and position information may be mapped to the main wiring diagram and associated with the corresponding secondary device, and device state information may be mapped to the bay wiring diagram and associated with the corresponding secondary device.

To be specific, an associated smart terminal, a corresponding logical device and a logical node may be determined in accordance with information in "LNode" of the circuit breaker or the knife (i.e., Conducting Equipment having a type of "CBR" or "DIS"). When InClass is XCBR/XSWI, a data object Pos at the logical node has described position information about the circuit breaker or the knife. A GOOSE data set may be traversed at a process level of the smart terminal, so as to determine a GOOSE entry which has provided the position information about the circuit breaker or the knife.

For example, a 220 kV outgoing line bay has a bay name of "2211" and a type of "CBR", an associated IED has a name of IL2201A, IdInst is RPIT and InClass is XCBR. The GOOSE data set of RPIT may be searched in accordance with IL2001A/RPIT/XCBR.pos, and a corresponding GOOSE entry may be mapped to a circuit breaker position display unit in the wiring diagram.

```
<ConductingEquipment name= "2211" type= "CBR">
    <SubEquipment name= "A" desc= "phase A" phase="A">
        <LNode iedName= "IL2201A" ldInst= "RPIT" prefix= "Q0A" lnClass= "XCBR" lnInst= "1"/>
    </SubEquipment>
    <SubEquipment name= "B" desc= "phase B" phase= "B">
        <LNode iedName= "IL2201A" ldInst= "RPIT" prefix= "Q0B" lnClass= "XCBR" lnInst= "1"/>
    </SubEquipment>
    <SubEquipment name= "C" desc= "phase C" phase= "C">
        <LNode iedName= "IL2201A" ldInst= "RPIT" prefix= "Q0C" lnClass= "XCBR" lnInst= "1"/>
    </SubEquipment>
</ConductingEquipment>
```

An associated combination unit, a corresponding logical device and a logical node may be determined in accordance with information in "LNode" of PT and CT (i.e., ConductingEquipment having a type of "VRT" or "CTR"). When InClass is TVTR/TCTR, a data object Vol at TVTR and a data object Amp at TCTR have described a voltage sampling value and a current sampling value respectively, and the voltage sampling value and the current sampling value may be extracted and mapped to a sampling data display unit in the wiring diagram.

The bay-associated protection devices and various logical nodes of the IED may be searched through the logical node Bay/LNode at each bay. These logical nodes have described a specific protection function provided by the protection device. Taking a line protection device as an example, at the node Bay, a bay name and description thereof have been given, and at the bay logical node, the logical nodes (e.g., the differential protection logical node PDIF, the distance protection logical node PDIS and an overcurrent protection logical node PTOC) and instance identifies of the line protection device PL2201A have been given. Through the extraction of the information, it is able to associate each bay with the protection devices and the protection functions in the bay.

```
    </Bay>
    <Bay name="2211" desc="220kV line protection device">
        <LNode iedName="PL2201A" ldInst="PROT" prefix="" lnClass="PDIF" lnInst="1"/>
        <LNode iedName="PL2201A" ldInst="PROT" prefix="" lnClass="PDIS" lnInst="1"/>
        <LNode iedName="PL2201A" ldInst="PROT" prefix="" lnClass="PTOC" lnInst="1"/>
    </Bay>
```

Step 206: reading a network communication message of the secondary device, and parsing and extracting relay protection state information, element position information and device operating state information about the secondary device in the network communication message.

The information about the primary device and the secondary device in each bay may be monitored online in real time in accordance with the connection relationship between the primary device and the secondary device. The network communication message may be acquired from the secondary device in the to-be-tested device via the testing communication network, and the state parameters, the position information and the device state information about the secondary device may be extracted from the network communication message.

Step 207: mapping the relay protection state information, the element position information and the device operating state information about the secondary device to the SSD topological diagram of the to-be-tested substation.

To be specific, a GOOSE message may be received from the smart terminal at the process level, so as to extract a GOOSE signal of a circuit breaker position, and display the position information and the state parameters about each switch knife in real time on the main wiring diagram. An SV message may be received from the combination unit at the process level, so as to extract SV sampling signals of the current and the voltage, and display the sampling state parameters of the current and the voltage in real time on the main wiring diagram.

An MMS message may be received from each to-be-tested device at the station level, so as to monitor the state information about the to-be-tested device (including soft straps such as a GOOSE reception strap, a GOOSE transmission strap and a functional strap) in real time on the bay wiring diagram. Entries of a data set "dsRelayEna" in the MMS message may be traversed in accordance with iedName of each bay protection device, so as to read and display states of the functional straps, a GOOSE output strap, a GOOSE input strap, and an SV input strap of the to-be-tested device. Information such as SV disconnection warning, a GOOSE disconnection warning, a device abnormality warning and starting/operating of the protection device may be monitored. Entries of the data sets dsWarning, dsAlarm, dsCommonstate in the MMS message may be traversed in accordance with iedName of the protection devices, so as to read and display various alarm information such as device abnormality, communication disconnection, and PT/CT disconnection. A data set dsTripInfo may be traversed, so as to map the device state information to the bay wiring diagram.

The SSD topological diagram of the primary device and the second device of the substation may be established in accordance with all the information on the main wiring diagram and the bay wiring diagram.

Step 208: acquiring a testing item from a predetermined testing item library in accordance with the SSD topological diagram of the to-be-tested substation, generating a testing scheme for the to-be-tested substation, performing a testing operation, and outputting a testing result. This step may refer to Step 103 mentioned hereinabove, and thus will not be particularly described herein.

According to the embodiments of the present disclosure, when the configuration information about the to-be-tested substation is correct, the SCD file of the to-be-tested substation may be parsed so as to generate the main wiring diagram and the bay wiring diagram. The connection relationship between the primary device and the secondary device in the to-be-tested device may be acquired in accordance with the main wiring diagram and the bay wiring diagram, and the network communication message of the secondary device may be acquired via the testing communication network, so as to acquire the SSD topological diagram of the to-be-tested substation. Then, the testing scheme in the SSD topological diagram may be acquired in accordance with the predetermined testing item library, so as to perform the testing operation. As a result, it is able to generate the SSD topological diagram of the to-be-tested substation in accordance with the system structure of the substation and the device configuration information, automatically generate the testing item and automatically perform the testing operation on the to-be-tested device, thereby to improve the visualization level and the intelligence level of the closed-loop test for the substation.

Figure 4:
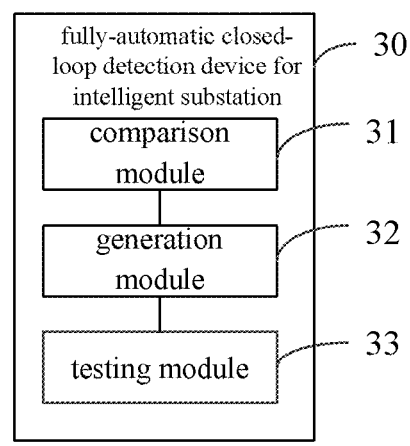
FIG. 4 is a schematic view showing a fully-automatic closed-loop detection device for an intelligent substation according to some embodiments of the present disclosure.

The present disclosure further provides in some embodiments a fully-automatic closed-loop detection device 30 for an intelligent substation which, as shown in FIG. 4, includes: a comparison module 31 configured to compare a SCD file of a to-be-tested substation with a device-type data template file, so as to determine whether configuration information about the to-be-tested substation is correct; a generation module 32 configured to, when the configuration information about the to-be-tested substation is correct, parse the SCD file and generate an SSD topological diagram of the to-be-tested substation; and a testing module 33 configured to acquire a testing item from a predetermined testing item library in accordance with the SSD topological diagram, generate a testing scheme for the to-be-tested substation, perform a testing operation, and output a testing result.

Figure 5:
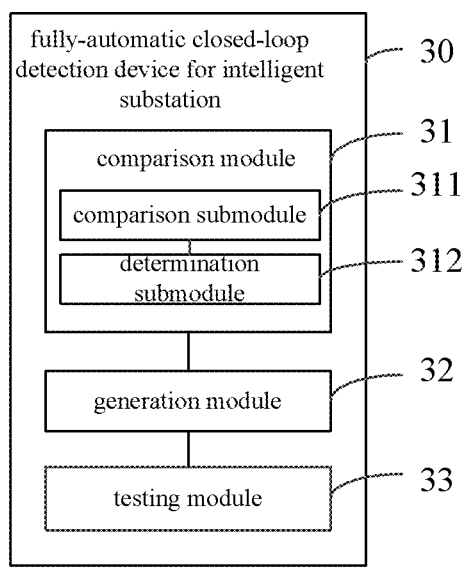
FIG. 5 is another schematic view showing the fully-automatic closed-loop detection device according to some embodiments of the present disclosure.

In some possible embodiments of the present disclosure, as shown in FIG. 5, the comparison module 301 includes: a comparison sub-module 311 configured to acquire the SCD file and a virtual terminal connection standard template file, and compare the SCD file with the virtual terminal connection standard template file, so as to determine whether a connection relationship between SCD virtual terminals of the to-be-tested substation is correct; and a determination sub-module 312 configured to, when the SCD virtual terminal connection is correct, read model configuration information in the SCD file, acquire a device operating model of the to-be-tested substation, and compare the model configuration information in the SCD file with the device operating model of the to-be-tested substation, so as to determine whether the configuration information about the to-be-tested substation is correct.

Figure 6:
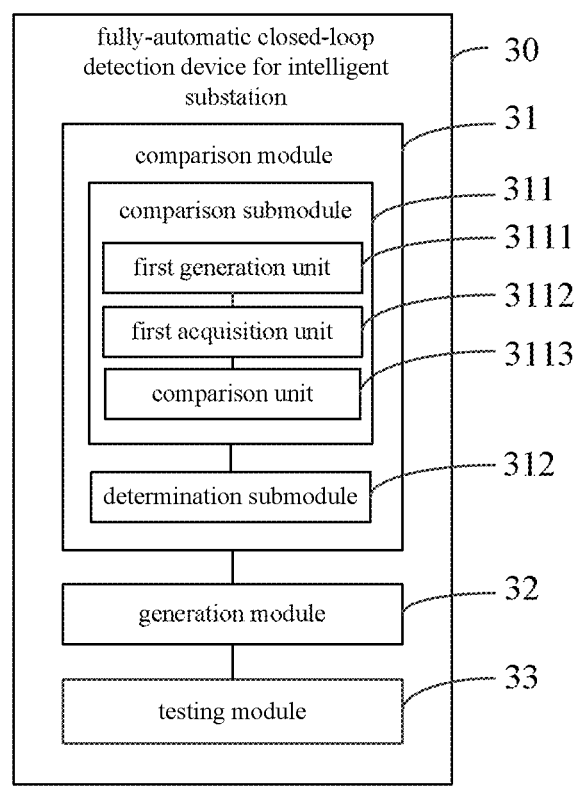
FIG. 6 is yet another schematic view showing the fully-automatic closed-loop detection device according to some embodiments of the present disclosure.

In some possible embodiments of the present disclosure, as shown in FIG. 6, the comparison submodule 311 includes: a first generation unit 3111 configured to generate a virtual terminal connection typical template library in accordance with the virtual terminal connection standard template file; a first acquisition unit 3112 configured to parse the SCD file, and acquire a connection relationship between virtual terminals for a protection device and an associated device in the SCD file; and a comparison unit 3113 configured to compare the connection relationship between the virtual terminals with the corresponding virtual terminal connection standard template file in the virtual terminal connection typical template library, so as to determine whether the connection relationship between the SCD virtual terminals of the to-be-tested substation is correct.

Figure 7:
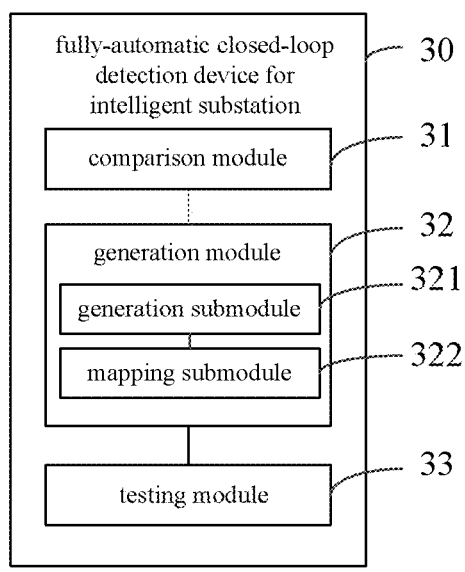
FIG. 7 is still yet another schematic view showing the fully-automatic closed-loop detection device according to some embodiments of the present disclosure.

In some possible embodiments of the present disclosure, as shown in FIG. 7, the generation module 32 includes: a generation submodule 321 configured to, when the configuration information about the to-be-tested substation is correct, parse the SCD file, and generate a main wiring diagram and a bay wiring diagram, so as to generate the SSD topological diagram of the to-be-tested substation, and acquire an association relationship between a primary device and a secondary device of the to-be-tested substation; and a mapping submodule 322 configured to read a network communication message of the secondary device, and map an operating parameter of the to-be-tested substation to the SSD topological diagram.

Figure 8:
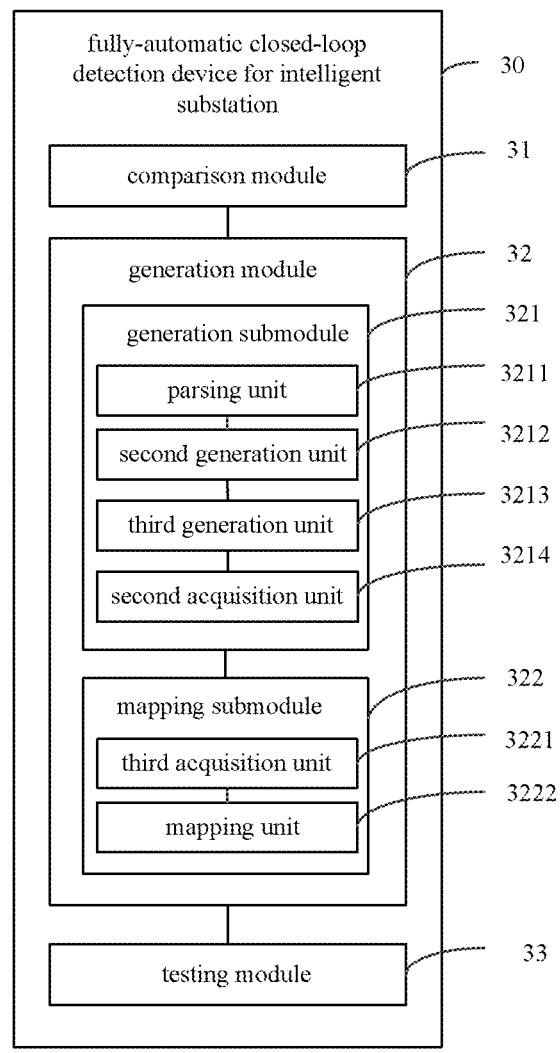
FIG. 8 is still yet another schematic view showing the fully-automatic closed-loop detection device according to some embodiments of the present disclosure.

In some possible embodiments of the present disclosure, as shown in FIG. 8, the generation submodule 321 includes: a parsing unit 3211 configured to parse the SCD file, so as to acquire a voltage level and bay information in the parsed SCD file; a second generation unit 3212 configured to generate a bay topological feature code in accordance with the bay information, and acquire a bay wiring diagram template adapted to the bay topological feature code from a predetermined bay device pattern template library, so as to generate the bay wiring diagram; a third generation unit 3213 configured to create a bus primitive in accordance with the voltage level, and arrange the bay wiring diagram in accordance with the bus primitive so as to generate the main wiring diagram; and a second acquisition unit 3214 configured to generate the SSD topological diagram of the to-be-tested substation in accordance with the bay wiring diagram and the main wiring diagram, and acquire the connection relationship between the primary device and the secondary device of the to-be-tested substation.

In some possible embodiments of the present disclosure, the mapping submodule 322 includes: a third acquisition unit 3221 configured to read the network communication message of the secondary device, so as to parse and extract relay protection state information, element position information and device operating state information about the secondary device from the network communication message; and a mapping unit 3222 configured to map the relay protection state information, the element position information and the device operating state information about the secondary device to the SSD topological diagram.

Figure 9:
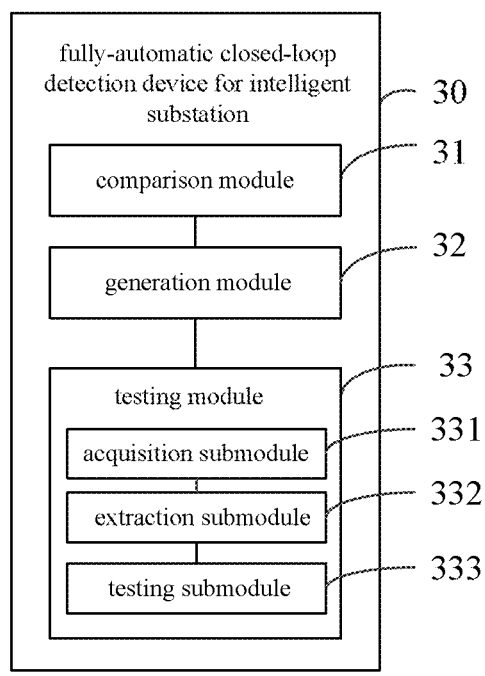
FIG. 9 is still yet another schematic view showing the fully-automatic closed-loop detection device according to some embodiments of the present disclosure.

In some possible embodiments of the present disclosure, as shown in FIG. 9, the testing module 33 includes: an acquisition submodule 331 configured to acquire information about a to-be-tested device of the to-be-tested substation in accordance with the SSD topological diagram and the SCD file; an extraction submodule 332 configured to extract testing items matching the information about the to-be-tested device from the predetermined testing item library, and generate the testing scheme for the to-be-tested substation in accordance with the testing items and a predetermined arrangement rule; and a testing submodule 333 configured to perform the testing operation on the to-be-tested substation in accordance with the testing scheme, and output the testing result.

Figure 10:
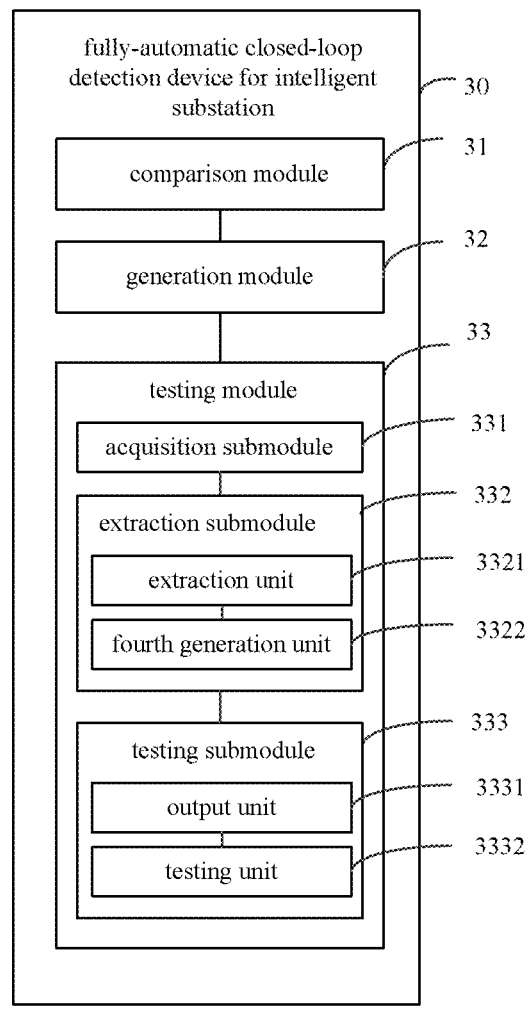
FIG. 10 is still yet another schematic view showing the fully-automatic closed-loop detection device according to some embodiments of the present disclosure.

In some possible embodiments of the present disclosure, as shown in FIG. 10, the extraction submodule 332 includes: an extraction unit 3321 configured to acquire a protection logical node of the to-be-tested device, and extract a testing item matching the protection logical node from the predetermined testing item library; and a fourth generation unit 3322 configured to generate the testing scheme for the to-be-tested substation in accordance with the extracted testing item and the predetermined arrangement rule.

In some possible embodiments of the present disclosure, the testing submodule 333 includes: an output unit 3331 configured to output a fault amount to the to-be-tested device corresponding to the testing item in the testing scheme, and set state information about the protection logical node in a target logical node model corresponding to the to-be-tested device; and a testing unit 3332 configured to compare the state information about the protection logical node in the target logical node model with actual operating state information about a corresponding protection logical node of the to-be-tested device, so as to perform the testing operation on the to-be-tested substation and output the testing result.

According to the embodiments of the present disclosure, the comparison module 31 compares the SCD file with the device-type data template file so as to determine whether the configuration information about the to-be-tested substation is correct. When the configuration information about the to-be-tested substation is correct, the generation module 32 parses the SCD file, so as to generate the SSD topological diagram of the to-be-tested substation. The testing module 33 acquires the testing item from the predetermined testing item library in accordance with the SSD topological diagram, so as to generate the testing scheme for the to-be-tested substation, perform the testing operation and output the testing result. As a result, it is able to automatically generate the testing item in accordance with the system structure of the substation and the device configuration information and automatically perform the testing operation on the to-be-tested device, thereby to increase a visualization level of the closed-loop test and reduce the work intensity of the working staff in the substation.

The present disclosure further provides in some embodiments an electronic device including a processor, a memory, and a computer program. The computer program is stored in the memory and capable of being executed by the processor so as to implement the above-mentioned fully-automatic closed-loop detection method with same or similar technical effects, which will not be particularly described herein.

The present disclosure further provides in some embodiments a computer-readable storage medium storing therein a computer program. The computer program is capable of being executed by a processor so as to implement the above-mentioned fully-automatic closed-loop detection method with a same technical effect, which will not be particularly defined herein. The computer-readable storage medium may be a Read-Only Memory (ROM), a Random Access Memory (RAM), a magnetic disk or an optical disk.

It should be appreciated that, units and steps described in the embodiments of the present disclosure may be implemented in the form of electronic hardware, or a combination of a computer program and the electronic hardware. Whether or not these functions are executed by hardware or software depends on specific applications or design constraints of the technical solution. Different methods may be adopted with respect to the specific applications so as to achieve the described functions, without departing from the scope of the present disclosure.

It should be further appreciated that, for convenience and clarification, operation procedures of the system, device and units described hereinabove may refer to the corresponding procedures in the method embodiment, and thus will not be particularly defined herein.

It should be further appreciated that, the device and method may be implemented in any other ways. For example, the embodiments for the apparatus is merely for illustrative purposes, and the modules or units are provided merely on the basis of their logic functions. During the actual application, some modules or units may be combined together or integrated into another system. Alternatively, some functions of the module or units may be omitted or not executed. In addition, the coupling connection, direct coupling connection or communication connection between the modules or units may be implemented via interfaces, and the indirect coupling connection or communication connection between the modules or units may be implemented in an electrical or mechanical form or in any other form.

The units may be, or may not be, physically separated from each other. The units for displaying may be, or may not be, physical units, i.e., they may be arranged at an identical position, or distributed on a plurality of network elements. Parts or all of the units may be selected in accordance with the practical need, so as to achieve the purpose of the present disclosure.

In addition, the functional units in the embodiments of the present disclosure may be integrated into a processing unit, or the functional units may exist independently, or two or more functional units may be combined together.

In the case that the functional units are implemented in a software form and sold or used as a separate product, they may be stored in a computer-readable medium. Based on this, the technical solutions of the present disclosure, partial or full, or parts of the technical solutions of the present disclosure contributing to the related art, may appear in the form of software products, which may be stored in a storage medium and include several instructions so as to enable computer equipment (a personal computer, a server or network equipment) to execute all or parts of the steps of the method according to the embodiments of the present disclosure. The storage medium includes any medium capable of storing therein program codes, e.g., a universal serial bus (USB) flash disk, a mobile hard disk (HD), a ROM, a RAM, a magnetic disk or an optical disk.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A fully-automatic closed-loop detection method for an intelligent substation, comprising:
    comparing a substation configuration description (SCD) file with a device-type data template file so as to determine whether configuration information about a to-be-tested substation is correct;
    when the configuration information about the to-be-tested substation is correct, parsing the SCD file, and generating a system specification description (SSD) topological diagram of the to-be-tested substation; and
    acquiring a testing item from a predetermined testing item library in accordance with the SSD topological diagram, generating a testing scheme for the to-be-tested substation, performing a testing operation and outputting a testing result, wherein the comparing the SCD file with the device-type data template file so as to determine whether the configuration information about the to-be-tested substation is correct comprises:

acquiring the SCD file and a virtual terminal connection standard template file, and comparing the SCD file with the virtual terminal connection standard template file so as to determine whether a connection relationship between SCD virtual terminals of the to-be-tested substation is correct; and when the connection relationship between the SCD virtual terminals of the to-be-tested substation is correct, reading model configuration information in the SCD file, acquiring a device operating model of the to-be-tested substation, and comparing the model configuration information in the SCD file with the device operating model of the to-be-tested substation, so as to determine whether the configuration information about the to-be-tested substation is correct.

2. The fully-automatic closed-loop detection method according to claim 1, wherein the acquiring the SCD file and the virtual terminal connection standard template file and comparing the SCD file with the virtual terminal connection standard template file so as to determine whether the connection relationship between the SCD virtual terminals of the to-be-tested substation is correct comprises:

generating a virtual terminal connection typical template library in accordance with the virtual terminal connection standard template file;

parsing the SCD file of the to-be-tested substation, and acquiring a connection relationship between virtual terminals of a protection device and an associated device in the SCD file; and comparing the connection relationship between the virtual terminals of the protection device and the associated device with the corresponding virtual terminal connection standard template file in the virtual terminal connection typical template library, so as to determine whether the connection relationship between the SCD virtual terminals of the to-be-tested substation is correct.

3. The fully-automatic closed-loop detection method according to claim 1, wherein the parsing the SCD file and generating the SSD topological diagram of the to-be-tested substation when the configuration information about the to-be-tested substation is correct comprises:

when the configuration information about the to-be-tested substation is correct, parsing the SCD file, generating a main wiring diagram and a bay wiring diagram to generate the SSD topological diagram of the to-be-tested substation, and acquiring an association relationship between a primary device and a secondary device of the to-be-tested substation; and reading a network communication message of the secondary device, and mapping an operating parameter of the to-be-tested substation to the SSD topological diagram of the to-be-tested substation.

4. The fully-automatic closed-loop detection method according to claim 3, wherein the parsing the SCD file, generating the main wiring diagram and the bay wiring diagram to generate the SSD topological diagram of the to-be-tested substation, and acquiring the association relationship between the primary device and the secondary device of the to-be-tested substation comprises:

parsing the SCD file, and acquiring a voltage level and bay information in the parsed SCD file;

generating a bay topological feature code in accordance with the bay information, and acquiring a bay wiring diagram template adapted to the bay topological feature code from a predetermined bay device pattern template library, so as to generate the bay wiring diagram;

creating a bus primitive in accordance with the voltage level, and arranging the bay wiring diagram in accordance with the bus primitive so as to generate the main wiring diagram; and generating the SSD topological diagram of the to-be-tested substation in accordance with the bay wiring diagram and the main wiring diagram, and acquiring the association relationship between the primary device and the secondary device of the to-be-tested substation.

5. The fully-automatic closed-loop detection method according to claim 3, wherein the reading the network communication message of the secondary device and mapping the operating parameter of the to-be-tested substation to the SSD topological diagram comprises:

reading the network communication message of the secondary device, and parsing and extracting relay protection state information, element position information and device operating state information about the secondary device from the network communication message; and mapping the relay protection state information, the element position information and the device operating state information about the secondary device to the SSD topological diagram.

6. The fully-automatic closed-loop detection method according to claim 1, wherein the acquiring the testing item from the predetermined testing item library in accordance with the SSD topological diagram, generating the testing scheme for the to-be-tested substation, performing the testing operation and outputting the testing result comprises:

acquiring information about a to-be-tested device of the to-be-tested substation in accordance with the SSD topological diagram and the SCD file;

extracting a testing item matching the information about the to-be-tested device from the predetermined testing item library, and generating the testing scheme for the to-be-tested substation in accordance with the testing item and a predetermined arrangement rule; and performing the testing operation on the to-be-tested substation in accordance with the testing scheme, and outputting the testing result.

7. The fully-automatic closed-loop detection method according to claim 6, wherein the extracting the testing item matching the information about the to-be-tested device from the predetermined testing item library, and generating the testing scheme for the to-be-tested substation in accordance with the testing item and the predetermined arrangement rule comprises:

acquiring a protection logical node of the to-be-tested device, and extracting a testing item matching the protection logical node from the predetermined testing item library; and generating the testing scheme for the to-be-tested substation in accordance with the extracted testing item and the predetermined arrangement rule.

8. The fully-automatic closed-loop detection method according to claim 6, wherein the performing the testing operation on the to-be-tested substation in accordance with the testing scheme and outputting the testing result comprises:

outputting a fault amount to the to-be-tested device corresponding to the testing item in the testing scheme, and setting state information about a protection logical node in a target logical node model corresponding to the to-be-tested device; and comparing the state information about the protection logical node in the target logical node model with actual operating state information about the protection logical node of the to-be-tested device, so as to perform the testing operation on the to-be-tested substation and output the testing result.

9. An electronic device, comprising one or more processors, a memory, and one or more computer programs, wherein the one or more computer programs are stored in the memory and capable of being executed by the one or more processors, so as to implement a fully-automatic closed-loop detection method for an intelligent substation, the method comprising:

comparing a substation configuration description (SCD) file with a device-type data template file so as to determine whether configuration information about a to-be-tested substation is correct;

when the configuration information about the to-be-tested substation is correct, parsing the SCD file, and generating a system specification description (SSD) topological diagram of the to-be-tested substation; and acquiring a testing item from a predetermined testing item library in accordance with the SSD topological diagram, generating a testing scheme for the to-be-tested substation, performing a testing operation and outputting a testing result, wherein the comparing the SCD file with the device-type data template file so as to determine whether the configuration information about the to-be-tested substation is correct comprises:

acquiring the SCD file and a virtual terminal connection standard template file, and comparing the SCD file with the virtual terminal connection standard template file so as to determine whether a connection relationship between SCD virtual terminals of the to-be-tested substation is correct; and when the connection relationship between the SCD virtual terminals of the to-be-tested substation is correct, reading model configuration information in the SCD file, acquiring a device operating model of the to-be-tested substation, and comparing the model configuration information in the SCD file with the device operating model of the to-be-tested substation, so as to determine whether the configuration information about the to-be-tested substation is correct.

10. The electronic device according to claim 9, wherein the acquiring the SCD file and the virtual terminal connection standard template file and comparing the SCD file with the virtual terminal connection standard template file so as to determine whether the connection relationship between the SCD virtual terminals of the to-be-tested substation is correct comprises:

generating a virtual terminal connection typical template library in accordance with the virtual terminal connection standard template file;

parsing the SCD file of the to-be-tested substation, and acquiring a connection relationship between virtual terminals of a protection device and an associated device in the SCD file; and comparing the connection relationship between the virtual terminals of the protection device and the associated device with the corresponding virtual terminal connection standard template file in the virtual terminal connection typical template library, so as to determine whether the connection relationship between the SCD virtual terminals of the to-be-tested substation is correct.

11. The electronic device according to claim 9, wherein the parsing the SCD file and generating the SSD topological diagram of the to-be-tested substation when the configuration information about the to-be-tested substation is correct comprises:

when the configuration information about the to-be-tested substation is correct, parsing the SCD file, generating a main wiring diagram and a bay wiring diagram to generate the SSD topological diagram of the to-be-tested substation, and acquiring an association relationship between a primary device and a secondary device of the to-be-tested substation; and reading a network communication message of the secondary device, and mapping an operating parameter of the to-be-tested substation to the SSD topological diagram of the to-be-tested substation.

12. The electronic device according to claim 11, wherein the parsing the SCD file, generating the main wiring diagram and the bay wiring diagram to generate the SSD topological diagram of the to-be-tested substation, and acquiring the association relationship between the primary device and the secondary device of the to-be-tested substation comprises:

parsing the SCD file, and acquiring a voltage level and bay information in the parsed SCD file;

generating a bay topological feature code in accordance with the bay information, and acquiring a bay wiring diagram template adapted to the bay topological feature code from a predetermined bay device pattern template library, so as to generate the bay wiring diagram;

creating a bus primitive in accordance with the voltage level, and arranging the bay wiring diagram in accordance with the bus primitive so as to generate the main wiring diagram; and generating the SSD topological diagram of the to-be-tested substation in accordance with the bay wiring diagram and the main wiring diagram, and acquiring the association relationship between the primary device and the secondary device of the to-be-tested substation.

13. The electronic device according to claim 11, wherein the reading the network communication message of the secondary device and mapping the operating parameter of the to-be-tested substation to the SSD topological diagram comprises:

reading the network communication message of the secondary device, and parsing and extracting relay protection state information, element position information and device operating state information about the secondary device from the network communication message; and mapping the relay protection state information, the element position information and the device operating state information about the secondary device to the SSD topological diagram.

14. The electronic device according to claim 9, wherein the acquiring the testing item from the predetermined testing item library in accordance with the SSD topological diagram, generating the testing scheme for the to-be-tested substation, performing the testing operation and outputting the testing result comprises:

acquiring information about a to-be-tested device of the to-be-tested substation in accordance with the SSD topological diagram and the SCD file;

extracting a testing item matching the information about the to-be-tested device from the predetermined testing item library, and generating the testing scheme for the to-be-tested substation in accordance with the testing item and a predetermined arrangement rule; and performing the testing operation on the to-be-tested substation in accordance with the testing scheme, and outputting the testing result.

15. The electronic device according to claim 14, wherein the extracting the testing item matching the information about the to-be-tested device from the predetermined testing item library, and generating the testing scheme for the to-be-tested substation in accordance with the testing item and the predetermined arrangement rule comprises:

acquiring a protection logical node of the to-be-tested device, and extracting a testing item matching the protection logical node from the predetermined testing item library; and generating the testing scheme for the to-be-tested substation in accordance with the extracted testing item and the predetermined arrangement rule.

16. The electronic device according to claim 14, wherein the performing the testing operation on the to-be-tested substation in accordance with the testing scheme and outputting the testing result comprises:

outputting a fault amount to the to-be-tested device corresponding to the testing item in the testing scheme, and setting state information about a protection logical node in a target logical node model corresponding to the to-be-tested device; and comparing the state information about the protection logical node in the target logical node model with actual operating state information about the protection logical node of the to-be-tested device, so as to perform the testing operation on the to-be-tested substation and output the testing result.

17. A non-transitory computer-readable storage medium storing therein a computer program, wherein the computer program is capable of being executed by a processor so as to implement a fully-automatic closed-loop detection method for an intelligent substation, the method comprising:

comparing a substation configuration description (SCD) file with a device-type data template file so as to determine whether configuration information about a to-be-tested substation is correct;

when the configuration information about the to-be-tested substation is correct, parsing the SCD file, and generating a system specification description (SSD) topological diagram of the to-be-tested substation; and acquiring a testing item from a predetermined testing item library in accordance with the SSD topological diagram, generating a testing scheme for the to-be-tested substation, performing a testing operation and outputting a testing result, wherein the comparing the SCD file with the device-type data template file so as to determine whether the configuration information about the to-be-tested substation is correct comprises:

acquiring the SCD file and a virtual terminal connection standard template file, and comparing the SCD file with the virtual terminal connection standard template file so as to determine whether a connection relationship between SCD virtual terminals of the to-be-tested substation is correct; and when the connection relationship between the SCD virtual terminals of the to-be-tested substation is correct, reading model configuration information in the SCD file, acquiring a device operating model of the to-be-tested substation, and comparing the model configuration information in the SCD file with the device operating model of the to-be-tested substation, so as to determine whether the configuration information about the to-be-tested substation is correct.

18. The non-transitory computer-readable storage medium according to claim 17, wherein the acquiring the SCD file and the virtual terminal connection standard template file and comparing the SCD file with the virtual terminal connection standard template file so as to determine whether the connection relationship between the SCD virtual terminals of the to-be-tested substation is correct comprises:

generating a virtual terminal connection typical template library in accordance with the virtual terminal connection standard template file;

parsing the SCD file of the to-be-tested substation, and acquiring a connection relationship between virtual terminals of a protection device and an associated device in the SCD file; and comparing the connection relationship between the virtual terminals of the protection device and the associated device with the corresponding virtual terminal connection standard template file in the virtual terminal connection typical template library, so as to determine whether the connection relationship between the SCD virtual terminals of the to-be-tested substation is correct.

19. The non-transitory computer-readable storage medium according to claim 17, wherein the parsing the SCD file and generating the SSD topological diagram of the to-be-tested substation when the configuration information about the to-be-tested substation is correct comprises:

when the configuration information about the to-be-tested substation is correct, parsing the SCD file, generating a main wiring diagram and a bay wiring diagram to generate the SSD topological diagram of the to-be-tested substation, and acquiring an association relationship between a primary device and a secondary device of the to-be-tested substation; and reading a network communication message of the secondary device, and mapping an operating parameter of the to-be-tested substation to the SSD topological diagram of the to-be-tested substation.

20. The non-transitory computer-readable storage medium according to claim 19, wherein the parsing the SCD file, generating the main wiring diagram and the bay wiring diagram to generate the SSD topological diagram of the to-be-tested substation, and acquiring the association relationship between the primary device and the secondary device of the to-be-tested substation comprises:

parsing the SCD file, and acquiring a voltage level and bay information in the parsed SCD file;

generating a bay topological feature code in accordance with the bay information, and acquiring a bay wiring diagram template adapted to the bay topological feature code from a predetermined bay device pattern template library, so as to generate the bay wiring diagram;

creating a bus primitive in accordance with the voltage level, and arranging the bay wiring diagram in accordance with the bus primitive so as to generate the main wiring diagram; and generating the SSD topological diagram of the to-be-tested substation in accordance with the bay wiring diagram and the main wiring diagram, and acquiring the association relationship between the primary device and the secondary device of the to-be-tested substation.

\* \* \* \* \*